United States Patent
Basu et al.

(10) Patent No.: US 11,094,716 B2
(45) Date of Patent: Aug. 17, 2021

(54) SOURCE CONTACT AND CHANNEL INTERFACE TO REDUCE BODY CHARGING FROM BAND-TO-BAND TUNNELING

(71) Applicant: INTEL CORPORATION, Santa Clara, CA (US)

(72) Inventors: Dipanjan Basu, Hillsboro, OR (US); Rishabh Mehandru, Portland, OR (US); Seung Hoon Sung, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/649,593

(22) PCT Filed: Jan. 12, 2018

(86) PCT No.: PCT/US2018/013588
§ 371 (c)(1),
(2) Date: Mar. 20, 2020

(87) PCT Pub. No.: WO2019/139619
PCT Pub. Date: Jul. 18, 2019

(65) Prior Publication Data
US 2020/0279872 A1      Sep. 3, 2020

(51) Int. Cl.
*H01L 27/12* (2006.01)
*H01L 21/84* (2006.01)
*H01L 29/06* (2006.01)
*H01L 29/66* (2006.01)
*H01L 29/417* (2006.01)

(52) U.S. Cl.
CPC ........ *H01L 27/1211* (2013.01); *H01L 21/845* (2013.01); *H01L 29/0638* (2013.01); *H01L 29/41791* (2013.01)

(58) Field of Classification Search
CPC .............. H01L 21/845; H01L 27/1211; H01L 29/0638; H01L 29/41791
See application file for complete search history.

(56) References Cited

U.S. PATENT DOCUMENTS

2007/0200173 A1 * 8/2007 Pelley, III ............... H01L 21/84
257/347
2009/0008705 A1    1/2009 Zhu et al.
(Continued)

FOREIGN PATENT DOCUMENTS

JP         2012060082       3/2012

OTHER PUBLICATIONS

International Search Report and Written Opinion from PCT/US2018/013588 dated Oct. 12, 2018, 14 pgs.
(Continued)

*Primary Examiner* — Herve-Louis Y Assouman
(74) *Attorney, Agent, or Firm* — Green, Howard & Mughal LLP (57) ABSTRACT

An apparatus is provided which comprises: a source and a drain with a semiconductor body therebetween, the source, the drain, and the semiconductor body on an insulator, a buried structure between the semiconductor body and the insulator, and a source contact coupled with the source and the buried structure, the source contact comprising metal. Other embodiments are also disclosed and claimed.

20 Claims, 8 Drawing Sheets

(56) References Cited

U.S. PATENT DOCUMENTS

| | | | |
|---|---|---|---|
| 2011/0115553 A1* | 5/2011 | Cai | H01L 21/84 |
| | | | 327/537 |
| 2012/0056250 A1 | 3/2012 | Snyder et al. | |
| 2013/0279145 A1 | 10/2013 | Then et al. | |
| 2014/0284666 A1 | 9/2014 | Grupp et al. | |

OTHER PUBLICATIONS

International Preliminary Report on Patentability from PCT/US2018/013588 dated Jul. 23, 2020, 9 pgs.

* cited by examiner

SOURCE CONTACT AND CHANNEL INTERFACE TO REDUCE BODY CHARGING FROM BAND-TO-BAND TUNNELING

CLAIM OF PRIORITY

This Application is a National Stage Entry of, and claims priority to, PCT Application No. PCT/US18/13588, filed on 12 Jan. 2018 and titled "SOURCE CONTACT AND CHANNEL INTERFACE TO REDUCE BODY CHARGING FROM BAND-TO-BAND TUNNELING", which is incorporated by reference in its entirety for all purposes.

BACKGROUND

In semiconductor devices, as transistor dimensions continue to shrink, semiconductor materials that have relatively lower energy band gaps (compared to silicon, for example) are becoming more commonly used. Some examples include group III-V materials and germanium that may include doping to further lower band gap energy levels. While these lower energy levels can have the benefit of requiring less energy to turn on a transistor, for example, in the off state there could be a greater risk of leakage current as a result of band-to-band tunneling (BTBT). Also, with silicon on insulator (SOI) technology, a transistor body forms a capacitor against the insulated substrate. As charge accumulates on this capacitor, the transistor can experience floating body effects, which may include adverse effects such as opening of parasitic transistors in the structure and causing off-state leakages.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

A source contact and channel interface to reduce body charging from band-to-band tunneling is generally presented. In this regard, embodiments of the present invention enable a dissipation path for minority carriers from the channel to the source contact. In this way, charge is prevented from building up and adverse floating body effects can be prevented. One skilled in the art would appreciate that this approach may enable higher performance silicon on insulator devices, including nanowire/nanoribbon devices using lower band gap materials.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not, necessarily for describing permanent relative positions.

Figure 1:
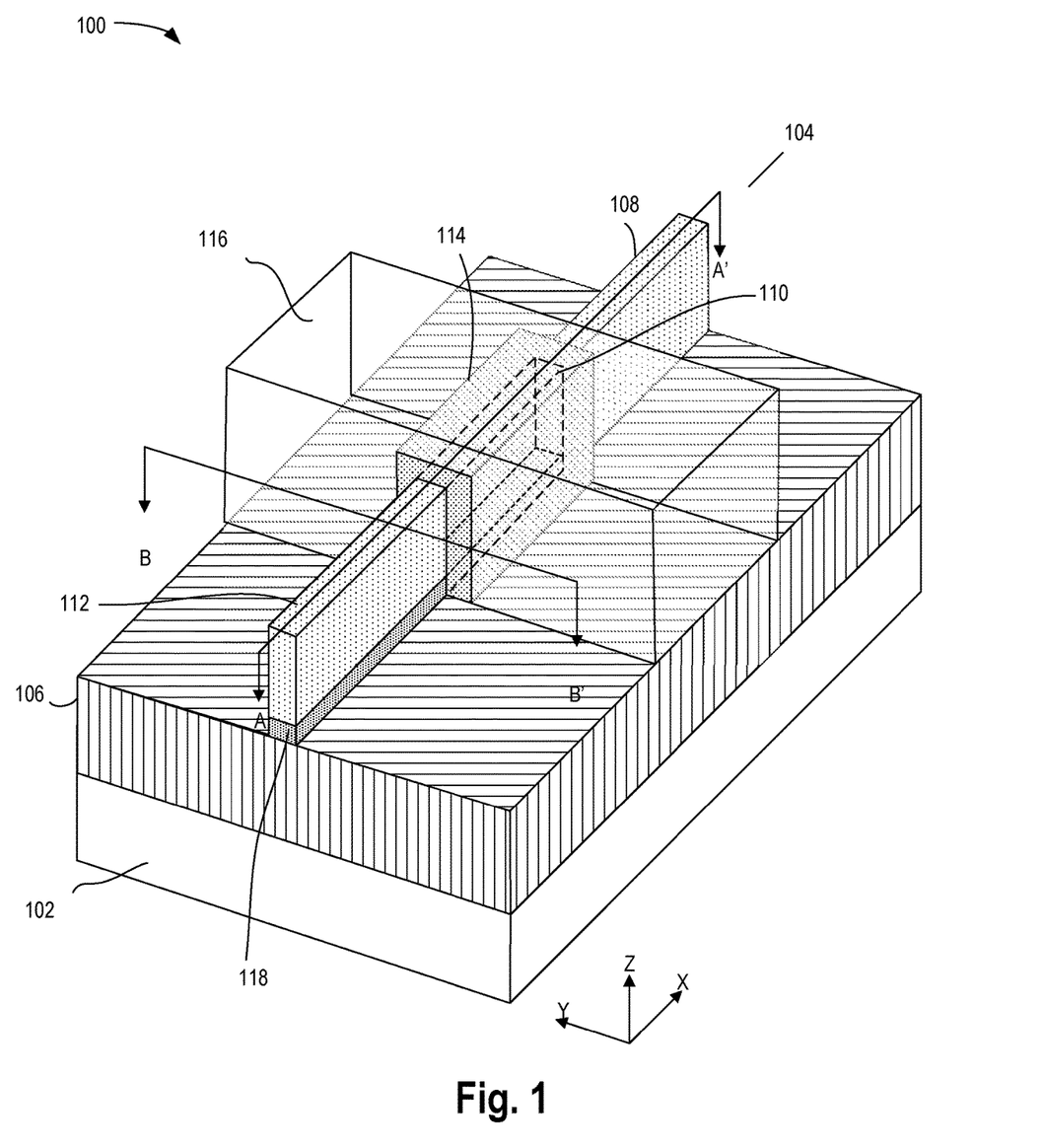
FIG. 1 illustrates a perspective view of an example semiconductor device with a source contact and channel interface, according to some embodiments.

FIG. 1 illustrates a perspective view of an example semiconductor device with a source contact and channel interface, according to some embodiments. As shown, device 100 includes substrate 102, fin 104, insulator 106, drain region 108, channel region 110, source region 112, gate dielectric 114, gate region 116, and interface layer 118. While shown as being a FinFET transistor, in other embodiments, device 100 may be a different topology, such as a nanowire/nanoribbon transistor, a planar transistor, or different device, such as a diode. While shown as including a single fin 104 and gate region 116, in some embodiments, device 100 may include multiple fins 104 and/or gate regions 116.

In some embodiments, substrate 102 comprises at least one layer of undoped semiconductor, such as Ge, Si, SiGe, InGaAs, AlSb, etc., which may form fin 104. In some embodiments, fin 104 may be formed by epitaxial re-growth in a trench or by blanket deposition and patterning. In some embodiments, fin 104, which may include drain region 108, channel region 110, and source region 112, may be formed separately from substrate 102 and may contain different semiconductor materials, including, but not limited to, InGaAs, InAs, InGaAlAs, InGaAsSb, InSb, GaSb, Ge, or SiGe. Substrate 102 may be composed of one or more semiconductor material layers on top of another semiconductor material such as silicon. In some embodiments, insulator 106 is composed of a buried oxide layer that may insulate fin 104 from substrate 102, while in other embodiments, fin 104 may be formed directly over substrate 102.

When device 100 is in an active mode, channel region 110 may serve as a channel between source region 112 and drain region 108, located on opposite sides of channel region 110. In some embodiments, device 100 may be a PMOS or NMOS transistor and source region 112 and drain region 108 are p-doped or n-doped variants of the same semiconductor as channel region 110.

Gate region 116, along with gate dielectric 114, may form a gate stack on channel region 110. Gate region 116 may be a metal coupled with interconnects, not shown, to provide a voltage proximate to channel region 110 to place device 100 into an active mode. In some embodiments, gate dielectric 114 may include one or more layers of oxides and/or nitrides, that may be formed over one or more sides of channel region 110.

Interface layer 118 may be present between insulator 106 and channel region 110 (and source region 112). In some embodiments, interface layer 118 may provide a dissipation path for charge from channel region 110 to a source contact (not shown). In some embodiments, interface layer 118 may be any undoped semiconductor material, including, but not limited to, silicon or germanium. In one embodiment, device 100 is a PMOS transistor with a channel region 110 of germanium for hole transport, and interface layer 118 may be silicon (or another material with a small band offset) such that electrons that may be generated from band-to-band tunneling could easily pass from the germanium into the silicon and then into the source contact.

In some embodiments, as shown in more detail hereinafter, interface layer 118 may be removed from under source region 112, which may be thinner than, shorter than, or otherwise asymmetrical with drain region 108, and replaced with a wraparound metal source contact.

FIGS. 2A-2F illustrate cross-sectional views of manufacturing steps of a semiconductor device with a source contact and channel interface, according to some embodiments. FIGS. 2A-2F may represent alternative embodiments of device 100 depicted along the plane created by lines A and A'. FIGS. 2A-2F are not drawn to scale and additional layers and/or features may also be included, but are not illustrated for enhanced clarity.

Figure 2A:
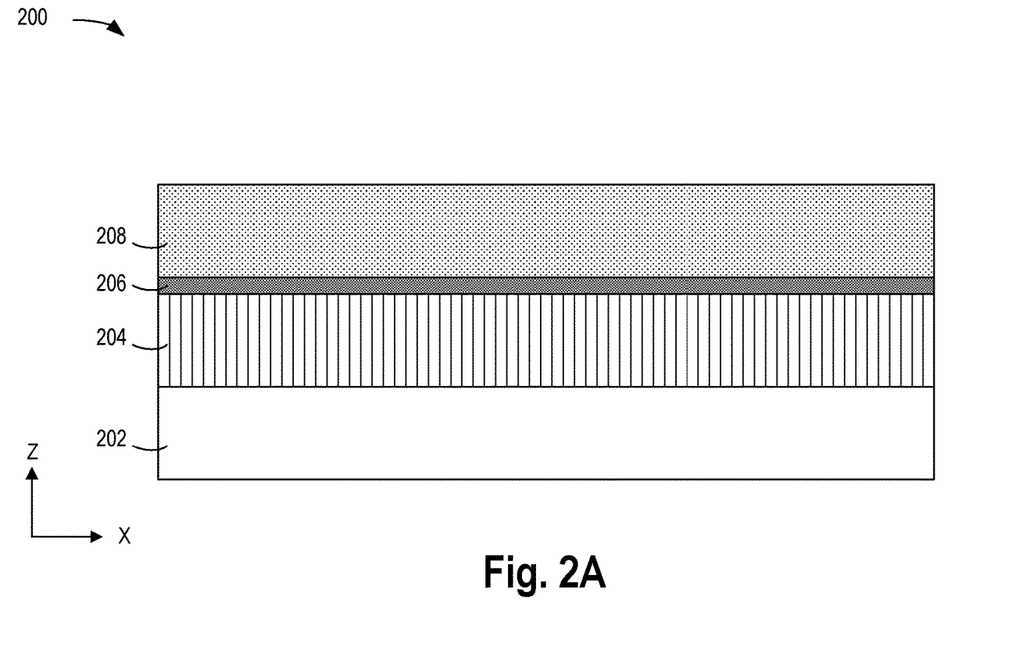
FIGS. 2A-2F illustrate cross-sectional views of manufacturing steps of a semiconductor device with a source contact and channel interface, according to some embodiments.

As shown in FIG. 2A, assembly 200 includes substrate 202, insulator 204, interface layer 206, and transistor body 208. In some embodiments, substrate 202 may be a silicon or other bulk substrate and may represent a portion of a larger wafer. In some embodiments, insulator 204 may be an oxide of silicon, or other insulator material, that may be deposited or grown on substrate 202. In some embodiments interface layer 206 may form a buried layer between transistor body 208 and insulator 204. Some factors that may inform the decision of the material to be used for interface layer 206 include, but are not limited to, energy band offset, lattice match, etch selectivity with transistor body 208. For example, in one embodiment, transistor body 208 may be germanium and interface layer 206 may be silicon. However, in various embodiments, other semiconductor materials may be used. While shown as being coextensive with transistor body 208, in some embodiments, interface layer 206 may be formed or patterned below portions of transistor body 208. In some embodiments, interface layer 206 may have a height of about 20% or less of the height of transistor body 208.

Figure 2B:
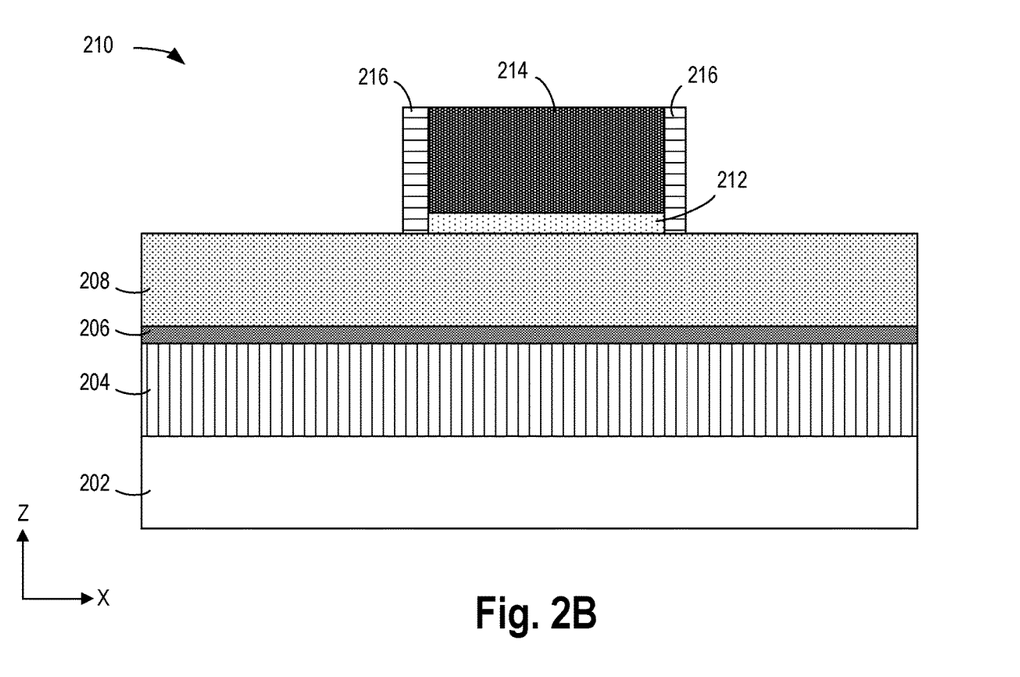

FIG. 2B shows assembly 210, which may include gate dielectric 212, gate contact 214 and spacers 216. In some embodiments, gate dielectric 212, gate contact 214 and spacers 216 may form a gate stack. In some embodiments, gate dielectric 212 may represent a high-k dielectric such as hafnium oxide, for example. In other embodiments, gate dielectric 212 may represent lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Although a few examples of materials that may be used to form gate dielectric 212 are described here, gate dielectric 212 may be made from other materials that serve to reduce gate leakage from the level present in devices that include silicon dioxide gate dielectrics.

In some embodiments, spacers 216 may be formed on either side of the gate contact 214 in any well-known manner to isolate the source/drain regions from the gate and/or act as an etch stop for additional processing steps. In some embodiments, a layer of germanide (not shown) may be formed on top of the source/drain regions if the source/drain regions comprise Ge. Ordinary, well-known, anisotropic etching may be used to fabricate the spacers 216. In some embodiments, a carbon-doped nitride, doped with 5-13% carbon concentration is used for spacers 216. In other embodiments, spacers 216 may be made of another nitride, such as silicon nitride for example. In some embodiments, gate contact 214 may be metal and may replace a previously formed polysilicon dummy gate.

Figure 2C:
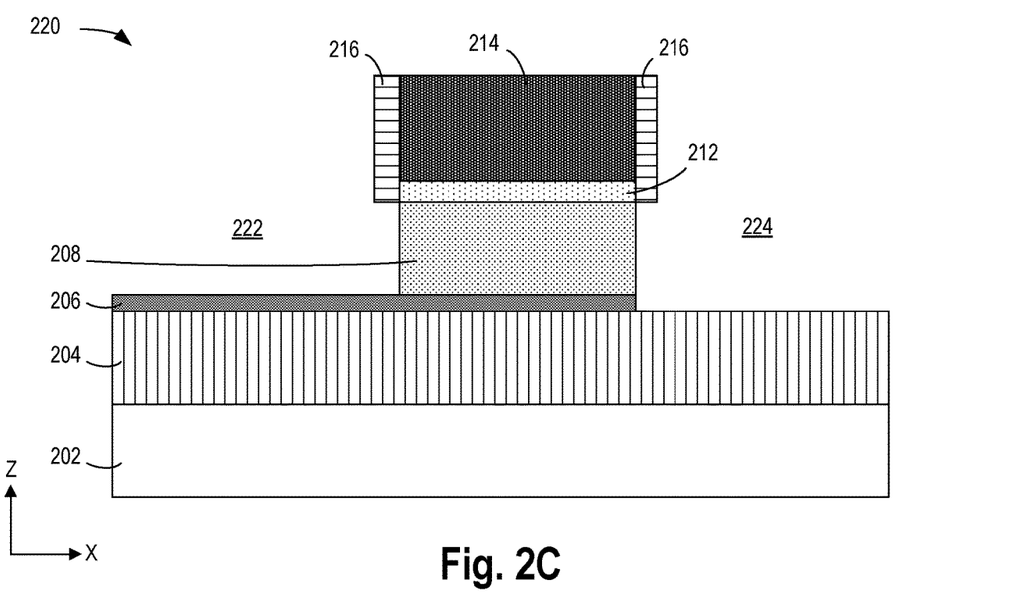

As shown in FIG. 2C, assembly 220 may have had source area 222 and drain area 224 etched out of transistor body 208. In some embodiments, source area 222 and drain area 224 may be formed using different etchants, or the same etchants under different conditions, such that interface layer 206 may remain under source area 222 and be removed from under drain area 224. In some embodiments, the etchant(s) used may be isotropic or anisotropic. While shown as including straight sidewalls, transistors body 208 may include slanted or curved sidewalls in some embodiments. In some embodiments, sidewalls of transistor body 208 and interface layer 206 adjacent drain area 224 are coplanar.

Figure 2D:
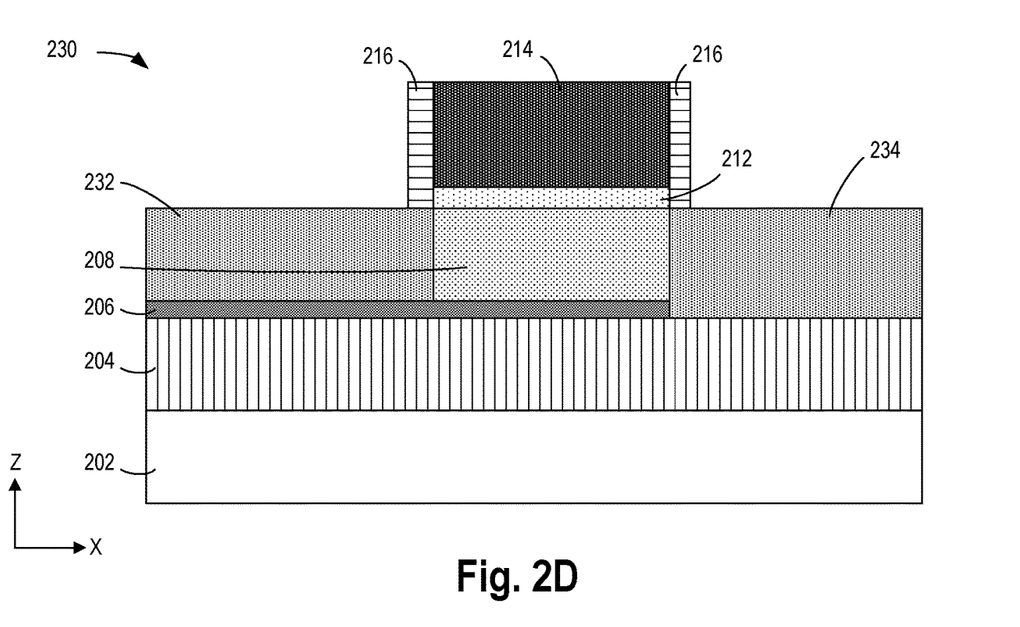

Turning now to FIG. 2D, assembly 230 may include source region 232 and drain region 234. In some embodiments, source region 232 and drain region 234 are epitaxially grown and may include a doped variety of the semiconductor material in transistor body 208. In some embodiments, source region 232 and drain region 234 may include dopants at a concentration of about one in twenty. As shown, source region 232 may be asymmetrical from drain region 234, for example, the location of interface layer 206 may produce a source region 232 with a depth less than a depth of drain region 234.

Figure 2E:
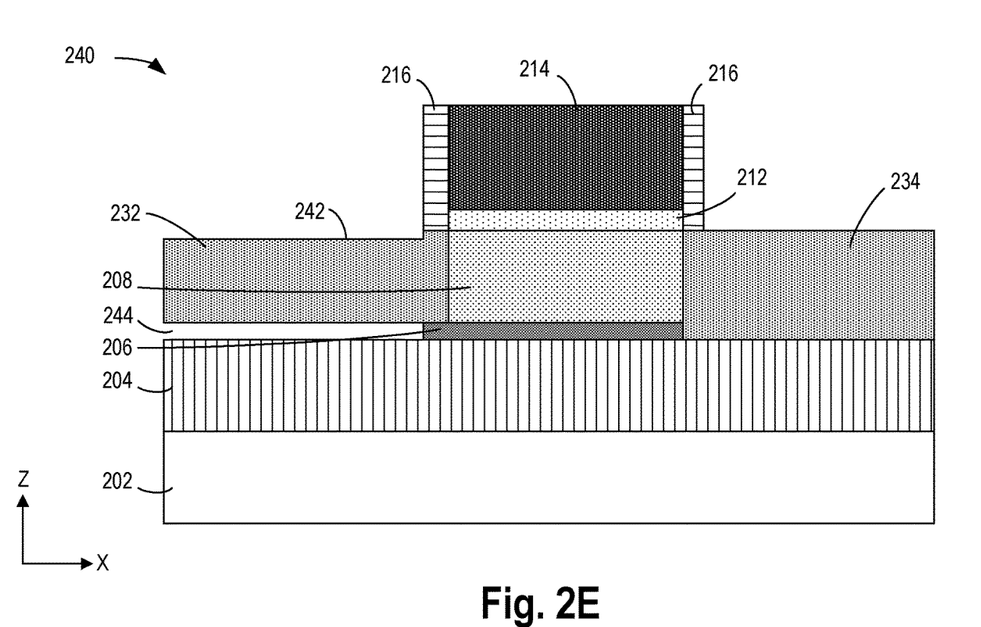

FIG. 2E shows assembly 240, which may have had portions of source region 232 and interface layer 206 etched away. In some embodiments, void 244 may be formed between source region 232 and insulator 204 by etching away portions of interface layer 206. In some embodiments, interface layer 206 may have a sidewall adjacent source region 232 that is coplanar with a sidewall of spacer 216. In some embodiments, source region 232 may be etched around multiple sides and surface 242 may be recessed below an upper surface of drain region 234.

Figure 2F:
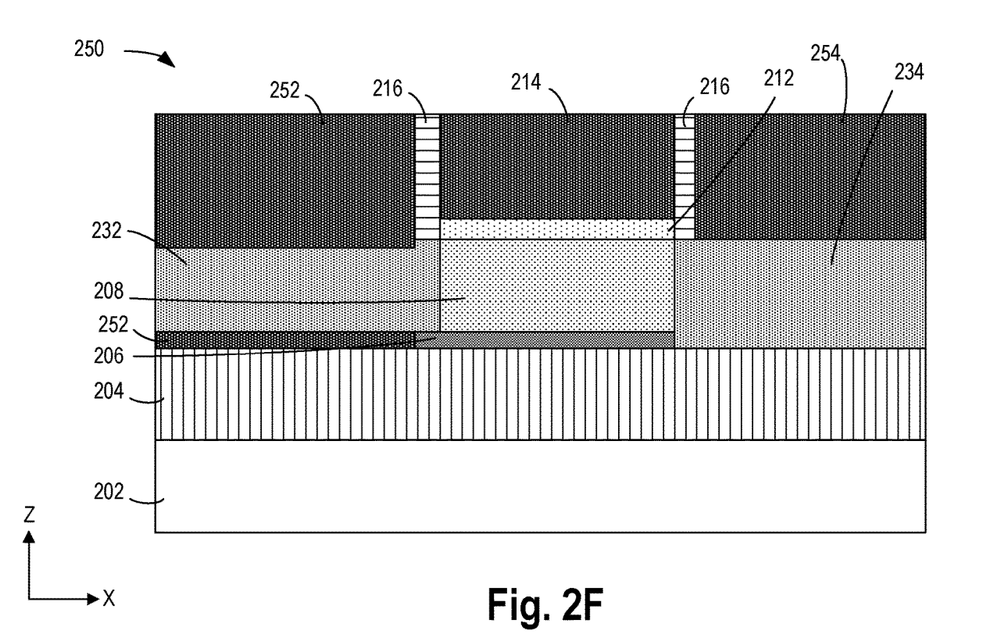

As shown in FIG. 2F, for assembly 250, source contact 252 and drain contact 254 may have been deposited on source region 232 and drain region 234, respectively. In some embodiments, source contact 252 may wrap around source region 232 and contact a sidewall of interface layer 206, which is in contact with channel region 208, thereby providing a dissipation path for potentially harmful charge carriers. In some embodiments, source contact 252 and drain contact 254 may be any suitable metal including, but not limited to, copper, titanium, tantalum, aluminum, or palladium.

FIGS. 3A-3D illustrate cross-sectional views of example source contact and channel interfaces, according to some embodiments. FIGS. 3A-3D may represent alternative embodiments of device 100 depicted along the plane created by lines B and B'. FIGS. 3A-3D are not drawn to scale and additional layers and/or features may also be included, but are not illustrated for enhanced clarity.

Figure 3A:
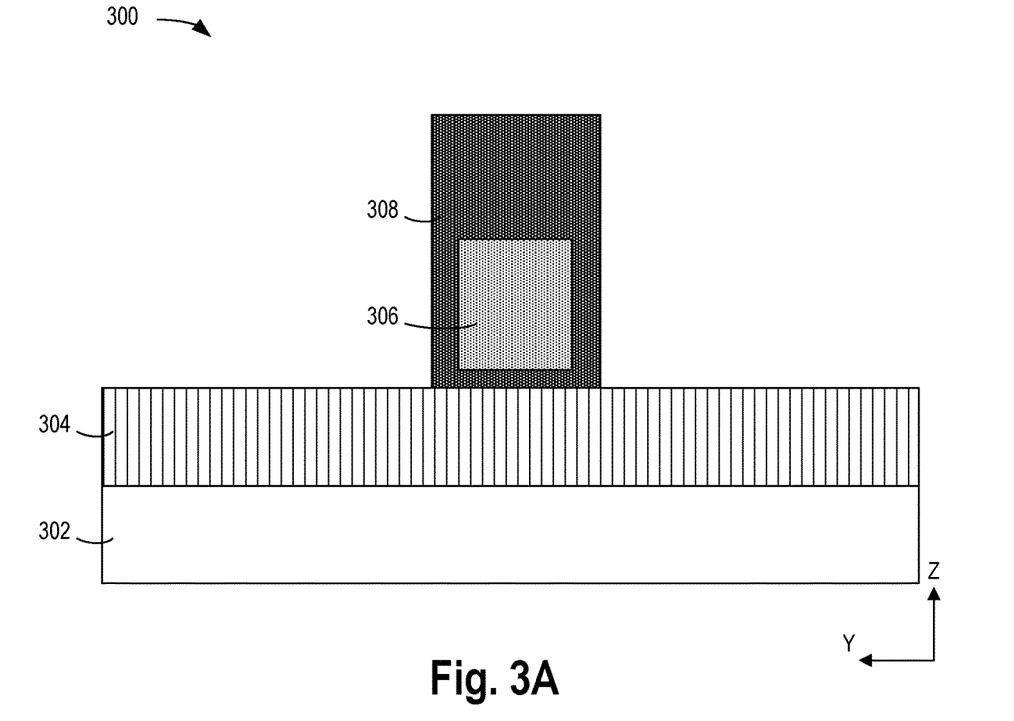
FIGS. 3A-3D illustrate cross-sectional views of example source contact and channel interfaces, according to some embodiments.

As shown in FIG. 3A, device 300 includes substrate 302, insulator 304, source region 306, and source contact 308. As shown, source contact 308 wraps completely around source region 306 and occupies the space between source contact 308 and insulator 304, however, in other embodiments, source contact 308 may only extend partially around source region 306. While not shown, source contact 308 would be coupled on a far side with an interface layer that is between a channel layer and insulator 304.

Figure 3B:
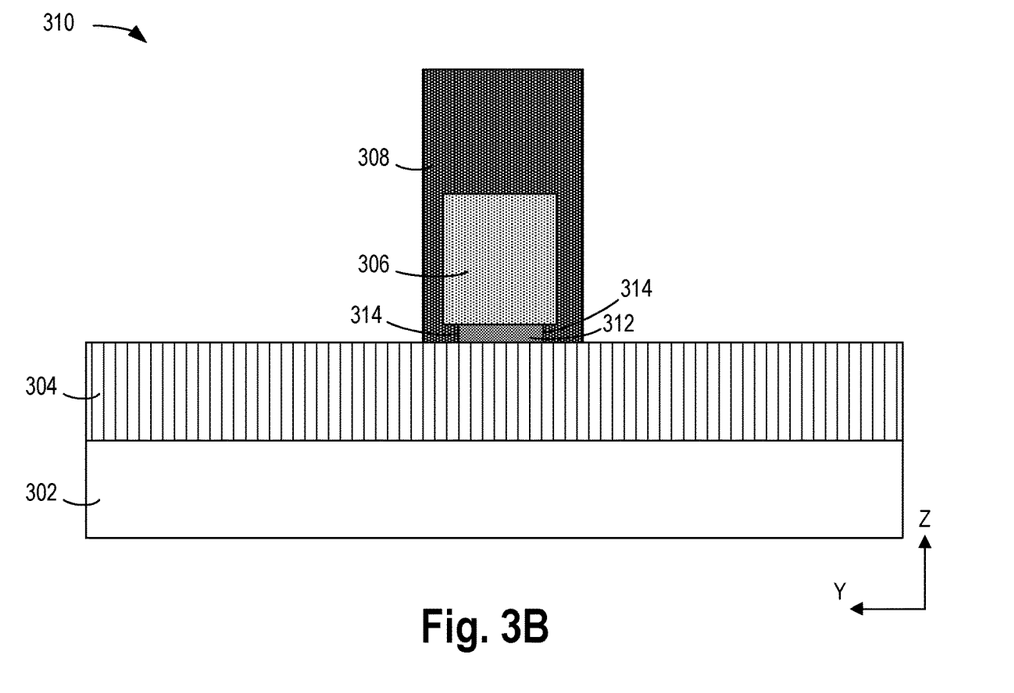

FIG. 3B shows assembly 310, which may include a portion of interface layer 312 between source region 306 and insulator 304. In some embodiments, an etch process may have been stopped before interface layer 312 was completely removed. In some embodiments, source contact 308 may be formed by any metal deposition process that results in source contact 308 coupling with interface layer 312 below source region 306 at sidewalls 312.

Figure 3C:
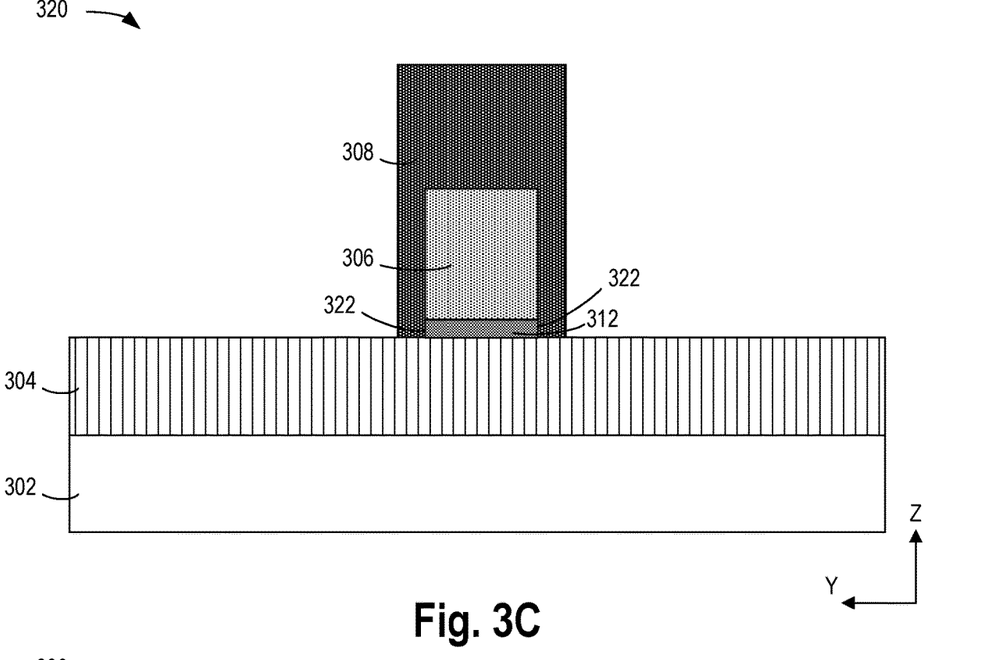

As shown in FIG. 3C, assembly 320 may have had an anisotropic etch to create vertical sidewalls while removing portions of source region 306 and interface layer 312. In some embodiments, source contact 308 may couple with interface layer 312 at sidewalls 322, which may be coplanar with sidewalls of source region 306.

Figure 3D:
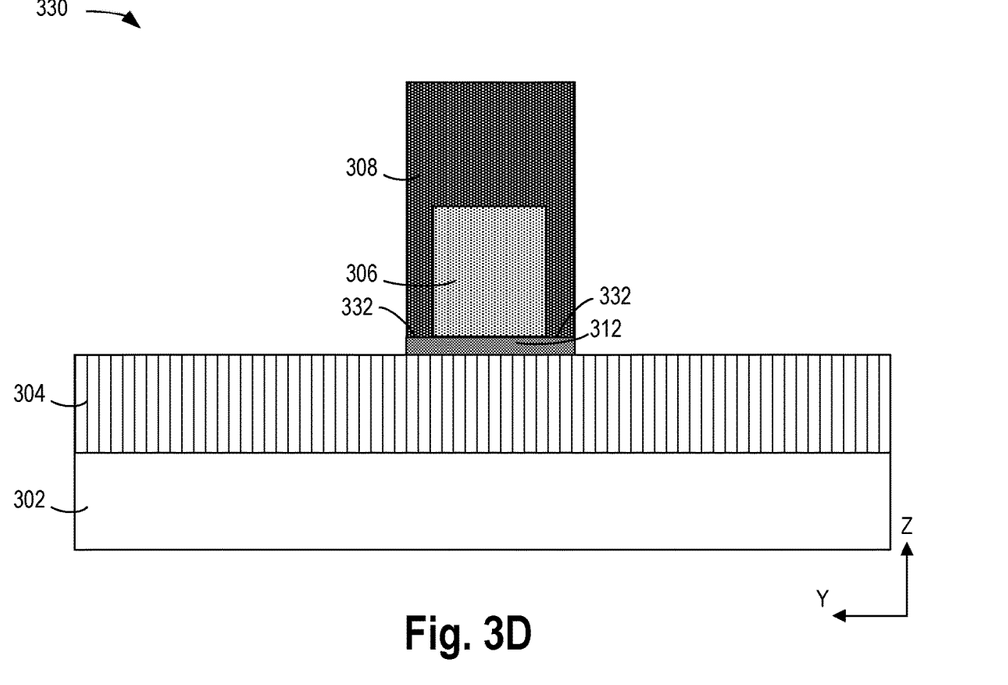

Turning now to FIG. 3D, assembly 330 may have had a selective etch to remove portions of source region 306 while leaving interface layer 312 unharmed In some embodiments, source contact 308 may couple with interface layer 312 at top surfaces 332, which may be coplanar with a bottom surface of source region 306.

Figure 4:
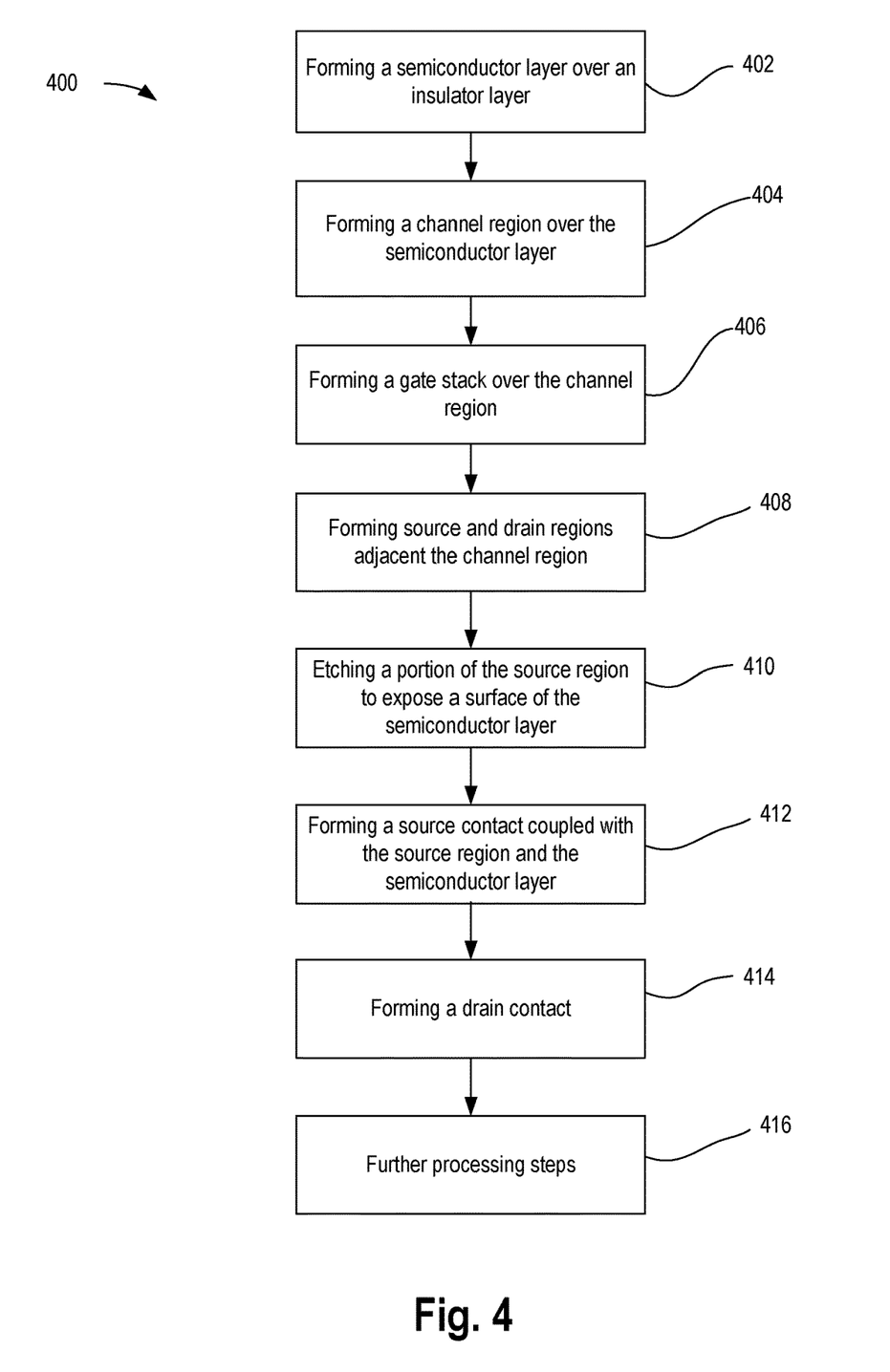
FIG. 4 illustrates a flowchart of a method of forming a semiconductor device with a source contact and channel interface, in accordance with some embodiments.

FIG. 4 illustrates a flowchart of a method of forming a semiconductor device with a source contact and channel interface, in accordance with some embodiments. Although the blocks in the flowchart with reference to FIG. 4 are shown in a particular order, the order of the actions can be modified. Thus, the illustrated embodiments can be performed in a different order, and some actions/blocks may be performed in parallel. Some of the blocks and/or operations listed in FIG. 4 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 400 begins with forming (402) a semiconductor layer over an insulator layer. In some embodiments, a blanket layer of silicon, germanium, or another undoped or very lightly doped semiconductor material is deposited over an insulator layer above a substrate. In some embodiments, the semiconductor layer may be patterned initially or subsequently. Next, a channel region is formed (404) over the semiconductor layer. In some embodiments, the channel region is composed of a blanket layer of high mobility, low bandgap semiconductor material, such as binary, ternary, or quaternary materials including group III and group V elements, for example.

Then, a gate stack may be formed (406) over the channel region. In some embodiments, a gate first process may form a metal gate with high k dielectric material, while in other embodiments a dummy gate may initially be formed and later replaced, or a gate made of other materials, such as polysilicon or low k dielectric may be used. Next, source and drain regions may be formed (408) adjacent the channel region. In some embodiments, an epi undercut may remove semiconductor material and a deposition process may grow the source and drain with doped semiconductor material. In some embodiments, an epi undercut may vary between the source and drain formation such that the semiconductor layer under the drain region is removed while the semiconductor layer under the source region is retained, such as in FIG. 2C.

The method continues with etching (410) a portion of the source region to expose a surface of the semiconductor layer. In some embodiments, the source region may be etched around a perimeter such that a void is created between the source region and the insulator by removing a portion of the semiconductor layer, for example as shown in FIG. 2E. In some embodiments a top surface and/or a side surface of the semiconductor layer may be exposed by etching portions of the source region. Next, a source contact may be formed (412) that is coupled with the source region and the semiconductor layer. In some embodiments, the source contact may couple with the semiconductor layer from above or from a side, for example as shown in FIGS. 3A-3D.

Then a drain contact may be formed (414) over the drain region. In some embodiments, the drain contact is asymmetrical from the source contact and does not contact the buried semiconductor layer. Finally, further processing steps (416) may be performed to form the semiconductor device. In some embodiments, interlayer dielectric and further interconnect layers are formed.

Figure 5:
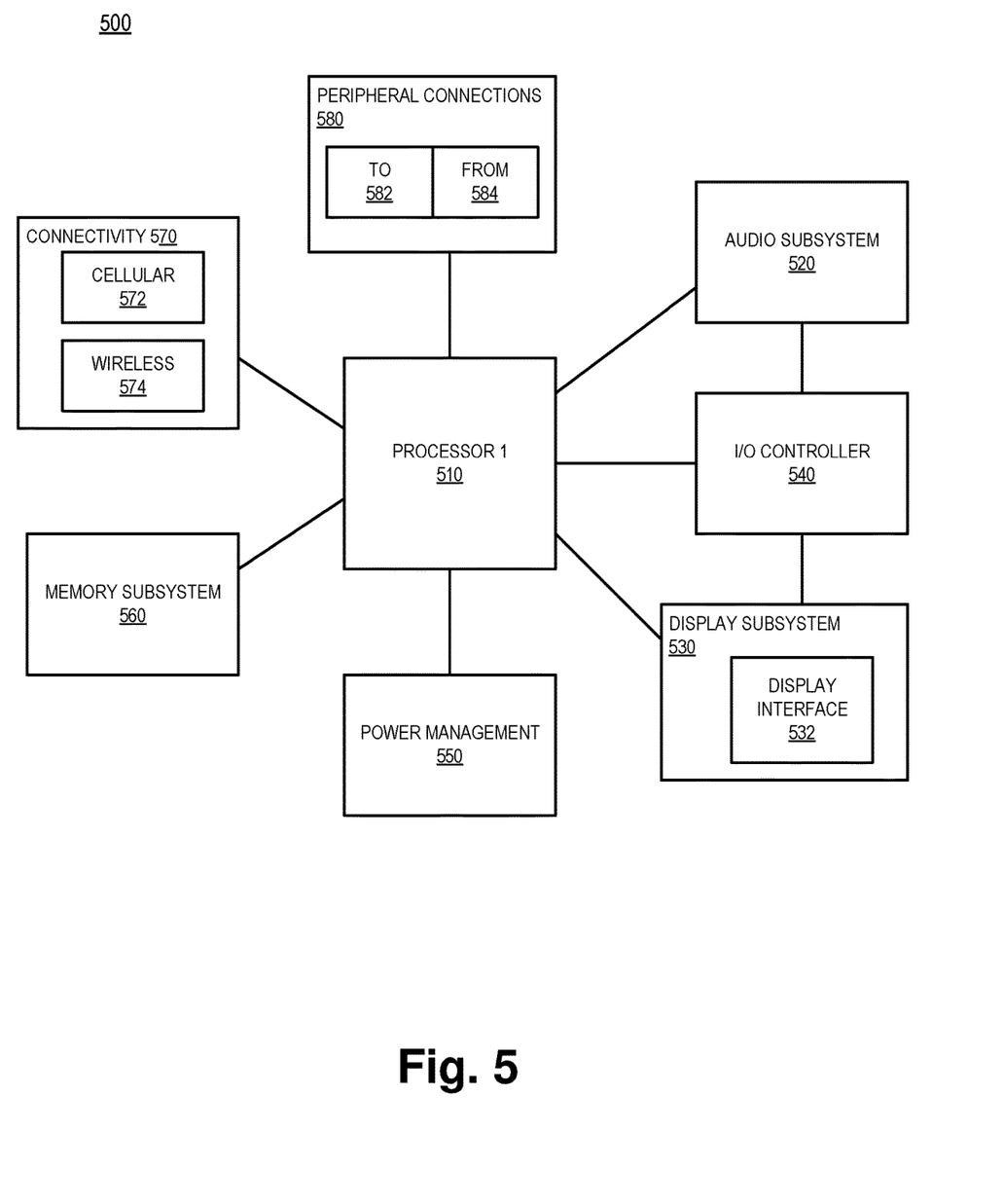
FIG. 5 illustrates a smart device or a computer system or a SoC (System-on-Chip) which includes a semiconductor device with a source contact and channel interface, according to some embodiments.

FIG. 5 illustrates a smart device or a computer system or a SoC (System-on-Chip) 500 which includes a semiconductor device with a source contact and channel interface, according to some embodiments. In some embodiments, computing device 500 represents a mobile computing device, such as a computing tablet, a mobile phone or smart-phone, a wireless-enabled e-reader, or other wireless mobile device. It will be understood that certain components are shown generally, and not all components of such a device are shown in computing device 500. In some embodiments, one or more components of computing device 500, for example processor 510 and/or memory subsystem 560, are include a semiconductor device with a source contact and channel interface as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TI-BT device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 500 includes a first processor 510. The various embodiments of the present disclosure may also comprise a network interface within 570 such as a wireless interface so that a system embodiment may be incorporated into a wireless device, for example, cell phone or personal digital assistant.

In one embodiment, processor 510 can include one or more physical devices, such as microprocessors, application processors, microcontrollers, programmable logic devices, or other processing means. The processing operations performed by processor 510 include the execution of an operating platform or operating system on which applications and/or device functions are executed. The processing operations include operations related to I/O (input/output) with a human user or with other devices, operations related to power management, and/or operations related to connecting the computing device 500 to another device. The processing operations may also include operations related to audio I/O and/or display I/O.

In one embodiment, computing device 500 includes audio subsystem 520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 500, or connected to the computing device 500. In one embodiment, a user interacts with the computing device 500 by providing audio commands that are received and processed by processor 510.

Display subsystem 530 represents hardware (e.g., display devices) and software (e.g., drivers) components that provide a visual and/or tactile display for a user to interact with the computing device 500. Display subsystem 530 includes display interface 532, which includes the particular screen or hardware device used to provide a display to a user. In one embodiment, display interface 532 includes logic separate from processor 510 to perform at least some processing related to the display. In one embodiment, display subsystem 530 includes a touch screen (or touch pad) device that provides both output and input to a user.

I/O controller 540 represents hardware devices and software components related to interaction with a user. I/O controller 540 is operable to manage hardware that is part of audio subsystem 520 and/or display subsystem 530. Additionally, I/O controller 540 illustrates a connection point for additional devices that connect to computing device 500 through which a user might interact with the system. For example, devices that can be attached to the computing device 500 might include microphone devices, speaker or stereo systems, video systems or other display devices, keyboard or keypad devices, or other I/O devices for use with specific applications such as card readers or other devices.

As mentioned above, I/O controller 540 can interact with audio subsystem 520 and/or display subsystem 530. For example, input through a microphone or other audio device can provide input or commands for one or more applications or functions of the computing device 500. Additionally, audio output can be provided instead of, or in addition to display output. In another example, if display subsystem 530 includes a touch screen, the display device also acts as an input device, which can be at least partially managed by I/O controller 540. There can also be additional buttons or switches on the computing device 500 to provide I/O functions managed by I/O controller 540.

In one embodiment, I/O controller 540 manages devices such as accelerometers, cameras, light sensors or other environmental sensors, or other hardware that can be included in the computing device 500. The input can be part of direct user interaction, as well as providing environmental input to the system to influence its operations (such as filtering for noise, adjusting displays for brightness detection, applying a flash for a camera, or other features).

In one embodiment, computing device 500 includes power management 550 that manages battery power usage, charging of the battery, and features related to power saving operation. Memory subsystem 560 includes memory devices for storing information in computing device 500. Memory can include nonvolatile (state does not change if power to the memory device is interrupted) and/or volatile (state is indeterminate if power to the memory device is interrupted) memory devices. Memory subsystem 560 can store application data, user data, music, photos, documents, or other data, as well as system data (whether long-term or temporary) related to the execution of the applications and functions of the computing device 500.

Elements of embodiments are also provided as a machine-readable medium (e.g., memory 560) for storing the computer-executable instructions. The machine-readable medium (e.g., memory 560) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 570 includes hardware devices (e.g., wireless and/or wired connectors and communication hardware) and software components (e.g., drivers, protocol stacks) to enable the computing device 500 to communicate with external devices. The computing device 500 could be separate devices, such as other computing devices, wireless access points or base stations, as well as peripherals such as headsets, printers, or other devices.

Connectivity 570 can include multiple different types of connectivity. To generalize, the computing device 500 is illustrated with cellular connectivity 572 and wireless connectivity 574. Cellular connectivity 572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 574 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 580 include hardware interfaces and connectors, as well as software components (e.g., drivers, protocol stacks) to make peripheral connections. It will be understood that the computing device 500 could both be a peripheral device ("to" 582) to other computing devices, as well as have peripheral devices ("from" 584) connected to it. The computing device 500 commonly has a "docking" connector to connect to other computing devices for purposes such as managing (e.g., downloading and/or uploading, changing, synchronizing) content on computing device 500. Additionally, a docking connector can allow computing device 500 to connect to certain peripherals that allow the computing device 500 to control content output, for example, to audiovisual or other systems.

In addition to a proprietary docking connector or other proprietary connection hardware, the computing device 500 can make peripheral connections 580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an integrated circuit device structure is provided comprising: a source and a drain with a semiconductor body therebetween, the source, the drain, and the semiconductor body on an insulator; a buried structure between the semiconductor body and the insulator; and a source contact coupled with the source and the buried structure, the source contact comprising metal.

In some embodiments, a junction between the buried structure and the drain is coplanar with the junction between the drain and the semiconductor body. Some embodiments also include: a first spacer structure adjacent a junction between the source and the semiconductor body; and a second spacer structure adjacent a junction between the drain and the semiconductor body, wherein a junction between the buried structure and the source contact is coplanar with a surface of the first spacer structure. In some embodiments, a depth of the source is less than a depth of the drain. In some embodiments, the source contact wraps around the source and a portion of the source contact is between the source and the insulator. In some embodiments, the source contact and the source are both coupled with the insulator. In some embodiments, the source contact is coupled with the insulator on opposite sides of the source, the buried structure between the source and the insulator. In some embodiments, the source and the drain comprise doped germanium. In some embodiments, the buried structure comprises undoped semiconductor material. In some embodiments, the insulator comprises silicon and oxygen. In some embodiments, the semiconductor body comprises germanium.

In another example, a system is provided comprising: a display subsystem; a wireless communication interface; and an integrated circuit device, the integrated circuit device comprising: a source and a drain with a semiconductor body therebetween, the source, the drain, and the semiconductor body on an insulator; a buried structure between the semiconductor body and the insulator; and a source contact coupled with the source and the buried structure, the source contact comprising metal.

In some embodiments, a junction between the buried structure and the drain is coplanar with the junction between the drain and the semiconductor body. In some embodiments, a depth of the source is less than a depth of the drain. In some embodiments, the source contact wraps around the source and a portion of the source contact is between the source and the insulator. In some embodiments, the source contact and the source are both coupled with the insulator. In some embodiments, the source contact is coupled with the insulator on opposite sides of the source, the buried structure between the source and the insulator. In some embodiments, the buried structure comprises silicon or germanium. In some embodiments, semiconductor body comprises germanium.

In another example, a method of forming an integrated circuit device structure is provided comprising: forming a first layer on an insulator, wherein the first layer comprises semiconductor material; forming a semiconductor body on the first layer; removing a portion of the first layer; forming a source and a drain on the insulator on opposite sides of the semiconductor body; and forming a source contact coupled with the source and the first layer.

In some embodiments, forming the source contact comprises: etching the source and the first layer to create an opening around the source and to expose the insulator and a surface of the first layer between the semiconductor body and the insulator; and depositing metal in the opening coupled with the source, the insulator, and the first layer. In some embodiments, forming the source contact comprises: etching a portion of the source and the first layer to create an opening adjacent the source and to expose the insulator and a surface of the first layer between the source and the insulator; and depositing metal in the opening coupled with the source, the insulator, and the first layer. In some embodiments, forming the source contact comprises: etching a u-shaped opening into the source and the first layer to expose the insulator and two surfaces of the first layer between the source and the insulator; and depositing metal in the opening coupled with the source, the insulator, and the first layer. In some embodiments, removing a portion of the first layer comprises etching the first layer from under the drain. In some embodiments, forming the semiconductor body on the first layer comprises forming a germanium layer on a silicon layer. Some embodiments also include forming a drain contact coupled with the drain, wherein the drain contact is asymmetrical with the source contact.

In another example, an integrated circuit device package is provided comprising: a package substrate; and an integrated circuit device, the integrated circuit device comprising: a source and a drain with a semiconductor body therebetween, the source, the drain, and the semiconductor body on an insulator, wherein the source is asymmetrical with the drain; a buried structure between the semiconductor body and the insulator, the buried structure comprising semiconductor material; and a source contact coupled with the source and the buried structure, the source contact comprising metal.

In some embodiments, a junction between the buried structure and the drain is coplanar with the junction between the drain and the semiconductor body. In some embodiments, a depth of the source is less than a depth of the drain. In some embodiments, the source contact wraps around the source and a portion of the source contact is between the source and the insulator. In some embodiments, the source contact and the source are both coupled with the insulator. In some embodiments, the source contact is coupled with the insulator on opposite sides of the source, the buried structure between the source and the insulator. In some embodiments, the buried structure comprises silicon or germanium. In some embodiments, the semiconductor body comprises germanium.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An integrated circuit device structure, comprising:
    a source and a drain with a semiconductor body therebetween, the source, the drain, and the semiconductor body on an insulator, wherein a depth of the source is less than a depth of the drain;
    a buried structure between the semiconductor body and the insulator; and
    a source contact coupled with the source and the buried structure, the source contact comprising metal.

2. The integrated circuit device structure of claim 1, wherein a junction between the buried structure and the drain is coplanar with the junction between the drain and the semiconductor body.

3. The integrated circuit device structure of claim 1, further comprising:
    a first spacer structure adjacent a junction between the source and the semiconductor body; and
    a second spacer structure adjacent a junction between the drain and the semiconductor body, wherein a junction between the buried structure and the source contact is coplanar with a surface of the first spacer structure.

4. The integrated circuit device structure of claim 1, wherein the source contact and the source are both coupled with the insulator.

5. The integrated circuit device structure of claim 1, wherein the source contact is coupled with the insulator on opposite sides of the source, the buried structure between the source and the insulator.

6. The integrated circuit device structure of claim 1, wherein the source and the drain comprise germanium.

7. The integrated circuit device structure of claim 6, wherein the buried structure comprises silicon.

8. The integrated circuit device structure of claim 7, wherein the insulator comprises silicon and oxygen.

9. The integrated circuit device structure of claim 8, wherein the semiconductor body comprises germanium.

10. An integrated circuit device structure, comprising:
    a source and a drain with a semiconductor body therebetween, the source, the drain, and the semiconductor body on an insulator;
    a buried structure between the semiconductor body and the insulator; and
    a source contact coupled with the source and the buried structure, the source contact comprising metal, wherein the source contact wraps around the source and a portion of the source contact is between the source and the insulator.

11. A system comprising:
    a display subsystem;
    a wireless communication interface; and
    an integrated circuit device, the integrated circuit device comprising:
        a source semiconductor and a drain semiconductor with a semiconductor body therebetween, the source semiconductor, the drain semiconductor, and the semiconductor body on an insulator;
        a buried semiconductor material between the semiconductor body and the insulator, the semiconductor material layer having a different bandgap than that of the semiconductor body; and
        a source contact coupled with the source and the buried semiconductor material, the source contact comprising metal.

12. The system of claim 11, wherein a junction between the buried semiconductor material and the drain semiconductor is coplanar with the junction between the drain semiconductor and the semiconductor body.

13. The system of claim 11, wherein a depth of the source semiconductor is less than a depth of the drain semiconductor.

14. The system of claim 11, wherein the source contact wraps around the source semiconductor and a portion of the source contact is between the source semiconductor and the insulator.

15. The system of claim 11, wherein the buried semiconductor comprises predominantly silicon.

16. The system of claim 11, wherein the buried semiconductor material is between the source semiconductor and the insulator.

17. The system of claim 11, wherein the buried semiconductor material comprises silicon and the semiconductor body comprises germanium.

18. The system of claim 17, wherein the source and drain semiconductor comprises germanium.

19. A method of forming an integrated circuit device structure comprising:
   forming a first layer on an insulator, wherein the first layer comprises a first semiconductor material;
   forming a semiconductor body on the first layer, wherein the semiconductor body comprises a second semiconductor material having a different bandgap than that of the first semiconductor material;
   removing a portion of the first layer;
   forming a source semiconductor and a drain semiconductor over the insulator on opposite sides of the semiconductor body with a source contact coupled with both the source semiconductor and the first layer.

20. The method of claim 19, wherein the method comprises:
   etching a portion of the first layer to create an opening between the source semiconductor and the insulator; and
   depositing a source contact metal within the opening, the source contact metal coupled with the source, the insulator, and the first layer.

* * * * *